(12) United States Patent
Okagawa (10) Patent No.: US 11,153,966 B2
(45) Date of Patent: Oct. 19, 2021

(54) ELECTRONIC CIRCUIT DEVICE (71) Applicant: SUMITOMO ELECTRIC INDUSTRIES, LTD., Osaka (JP)

(72) Inventor: Yuusuke Okagawa, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 58 days.

(21) Appl. No.: 16/758,151

(22) PCT Filed: Jul. 18, 2018

(86) PCT No.: PCT/JP2018/026859
§ 371 (c)(1),
(2) Date: Apr. 22, 2020

(87) PCT Pub. No.: WO2019/092926
PCT Pub. Date: May 16, 2019

(65) Prior Publication Data
US 2020/0288562 A1     Sep. 10, 2020

(30) Foreign Application Priority Data

Nov. 8, 2017   (JP) .............................. JP2017-215915

(51) Int. Cl.
*H05K 1/02* (2006.01)
*H02M 3/158* (2006.01)
(Continued)

(52) U.S. Cl.
CPC ........ *H05K 1/0206* (2013.01); *H02M 3/1588* (2013.01); *H05K 1/115* (2013.01);
(Continued)

(58) Field of Classification Search
CPC ................................................... H05K 1/0206
See application file for complete search history.

(56) References Cited

U.S. PATENT DOCUMENTS

| | | | | | |
|---|---|---|---|---|---|
| 5,973,923 A | * | 10/1999 | Jitaru | ....................... | H01F 27/06 165/185 |
| 8,040,930 B2 | * | 10/2011 | Mizusako | ............... | H01S 5/042 372/38.02 |
| 2014/0240946 A1 | | 8/2014 | Fukumasu et al. | | |

FOREIGN PATENT DOCUMENTS

| | | |
|---|---|---|
| JP | 2003-164040 A | 6/2003 |
| JP | 2012-186421 A | 9/2012 |

(Continued)

*Primary Examiner* — Mukundbhai G Patel
(74) *Attorney, Agent, or Firm* — Oliff PLC (57) ABSTRACT

The electronic circuit device includes: a first wiring pattern which is formed on a first main surface of a circuit board, has circuit elements including a switching element and mounted along a predetermined direction, and includes a virtual shortest current path connecting the circuit elements to each other along the predetermined direction; a second wiring pattern which is formed on a second main surface, and includes an opposing current path that opposes an area where the virtual shortest current path is formed; vias electrically connecting the first and second wiring patterns; and vias for heat transfer, connecting a mount area for the switching elements on the first main surface with an area on a side of the opposing current path on the second main surface. The heat dissipation member is in contact with the second main surface.

10 Claims, 8 Drawing Sheets

(51) Int. Cl.
*H05K 1/11* (2006.01)
*H05K 1/18* (2006.01)
*H05K 7/20* (2006.01)

(52) U.S. Cl.
CPC .............. *H05K 1/181* (2013.01); *H05K 7/209* (2013.01); *H05K 2201/066* (2013.01); *H05K 2201/10053* (2013.01); *H05K 2201/10522* (2013.01)

(56) References Cited

FOREIGN PATENT DOCUMENTS

| | | |
|---|---|---|
| JP | 2013-099057 A | 5/2013 |
| JP | 2016-503963 A | 2/2016 |
| WO | 2014/105887 A1 | 7/2014 |

* cited by examiner

ELECTRONIC CIRCUIT DEVICE

TECHNICAL FIELD

The present invention relates to an electronic circuit device.

This application claims priority on Japanese Patent Application No. 2017-215915 filed on Nov. 8, 2017, the entire contents of which are incorporated herein by reference.

BACKGROUND ART

Patent Literature 1 discloses a circuit assembly in which bus bars forming a power circuit are efficiently cooled by a simple structure. This circuit assembly includes a plurality of bus bars forming the power circuit, and a heat dissipation member for cooling the bus bars. The heat dissipation member has a bus bar bonding surface coated with an insulating layer. While the plurality of bus bars are arranged on the bus bar bonding surface, the respective bus bars are directly bonded to the bus bar bonding surface.

The circuit assembly is applicable to, for example, an electric junction box including: a power distribution circuit formed by laminating a plurality of bus bar boards; and a breaker element, a switching element, a DC regulator for converting an input DC voltage to a desired output voltage, etc., which are incorporated in the power distribution circuit. The electric junction box distributes electric power from a common on-vehicle power supply to electronic units.

Patent Literature 2 discloses an electronic device which is a power conversion device (DC/DC converter) mounted on an electric vehicle or a plug-in hybrid vehicle and configured to perform power conversion from a high-voltage storage battery to a low-voltage storage battery or power conversion from a low-voltage storage battery to a high-voltage storage battery. In order to reduce mixing of noise into electronic equipment, etc., arranged outside the power conversion device, filter circuits such as an input filter circuit and an output filter circuit are connected to an input side and an output side, respectively, of a power conversion circuit. Since this electronic device is provided with the filter circuits in which adverse effect of electromagnetic noise propagating through a space from a circuit board is reduced and parasitic inductance is reduced, the electronic device can output a voltage in which noise is sufficiently reduced.

Specifically, the electronic device includes: a casing; a circuit board provided in the casing; and an external terminal, penetrating a through-hole provided in the casing, through which an output from the circuit board is outputted to the outside or an input from the outside is inputted to the circuit board. The electronic device further includes: a filter means having a filter capacitor; a first wiring connecting the external terminal and the filter means; and a second wiring connecting the casing and the filter means. The second wiring is connected to the casing at a position closer to the external terminal relative to the filter means. As a result, parasitic inductance and electromagnetic induction are reduced to ensure the filter function.

CITATION LIST

Patent Literature

PATENT LITERATURE 1: Japanese Laid-Open Patent Publication No. 2003-164040

PATENT LITERATURE 2: Japanese Laid-Open Patent Publication No. 2013-99057

SUMMARY OF INVENTION

An electronic circuit device according to an aspect of the present disclosure is provided with: a multilayer circuit board having mounted thereon a plurality of circuit elements including a switching element to form a power conversion circuit, the multilayer circuit board having formed a wiring pattern electrically connecting the circuit elements to each other; and a heat dissipation member being in contact with the multilayer circuit board. The electronic circuit device includes: a first wiring pattern formed on a first main surface of the multilayer circuit board, the first wiring pattern having the plurality of circuit elements including the switching element, mounted thereon along a predetermined direction, the first wiring pattern including a virtual shortest current path connecting the circuit elements to each other along the predetermined direction; a second wiring pattern formed on a surface of a specific layer including a second main surface opposing the first main surface, the second wiring pattern including an opposing current path that opposes an area where the virtual shortest current path is formed; vias configured to electrically connect the first wiring pattern formed on the first main surface with the second wiring pattern formed on the surface of the specific layer; and vias for heat transfer, configured to connect a mount area for the switching element on the first main surface with the second main surface, in an area on a side of the opposing current path. The heat dissipation member is in contact with the second main surface, and heat generated in the switching element is dissipated by the heat dissipation member through the vias for heat transfer.

DESCRIPTION OF EMBODIMENTS

Technical Problem

In the power conversion devices such as the DC regulator disclosed in Patent Literatures 1 and 2, in order to realize high-density mounting, a double-sided board or a multilayer board is adopted in which circuit elements mounted on the respective layers are electrically connected to each other through narrow wiring patterns and vias.

In such circuit boards, distributed constant circuits consisting of L, C, and R are three-dimensionally formed between a wiring pattern of a signal line and a wiring pattern of a ground line, between wires, between vias, and between mounted circuit elements, which causes parasitic capacitance and parasitic inductance existing in the circuit boards.

In particular, the value of parasitic inductance tends to be inversely proportional to a wiring pattern width and be proportional to a wiring length, and a copper foil pattern formed on the inner walls of the vias for electrically connecting the wiring patterns formed on the both surfaces of the circuit board is thin. Therefore, parasitic inductance having a large value occurs.

Adversely affected by such parasitic inductance, a large surge voltage is likely to be applied to a semiconductor switching element incorporated in the power conversion device, at the time of switching. Therefore, a high withstand voltage semiconductor switching element needs to be adopted. However, a high withstand voltage semiconductor switching element may cause a problem that ON resistance increases and thereby conduction loss increases, and a problem that the switching time increases and thereby power loss is increased.

The circuit assembly disclosed in Patent Literature 1 is mainly intended for cooling the plurality of bus bars forming the power circuit by bringing the bus bars into contact with the heat dissipation member. Therefore, there is room for improvement in enhancing heat dissipation performance of, not the bus bars, but the semiconductor switching element mounted on the circuit board, and in eliminating adverse effect due to parasitic inductance that occurs in the power circuit including the semiconductor switching element.

Meanwhile, the electronic device disclosed in Patent Literature 2 is intended for reducing adverse effect of noise by parasitic inductance or the like that occurs in the wiring of the filter circuits. Therefore there is a room for improvement in enhancing heat dissipation performance of the semiconductor switching element mounted on the circuit board, and in reducing adverse effect of parasitic inductance that occurs in the power conversion device.

In view of the above problems, an object of this disclosure is to provide an electronic circuit device having excellent heat dissipation performance while minimizing adverse effect of parasitic inductance.

Effect of the Present Disclosure

According to the present disclosure, it is possible to provide an electronic circuit device having excellent heat dissipation performance while minimizing adverse effect of parasitic inductance.

DESCRIPTION OF EMBODIMENTS

First, contents of embodiments of the present disclosure, according to one aspect, are for description.

(1) An electronic circuit device according to one embodiment includes: a multilayer circuit board having mounted thereon a plurality of circuit elements including a switching element to form a power conversion circuit, the multilayer circuit board having formed a wiring pattern electrically connecting the circuit elements to each other; and a heat dissipation member being in contact with the multilayer circuit board. The electronic circuit device includes: a first wiring pattern formed on a first main surface of the multilayer circuit board, the first wiring pattern having the plurality of circuit elements including the switching element, mounted thereon along a predetermined direction, the first wiring pattern including a virtual shortest current path connecting the circuit elements to each other along the predetermined direction; a second wiring pattern formed on a surface of a specific layer including a second main surface opposing the first main surface, the second wiring pattern including an opposing current path that opposes an area where the virtual shortest current path is formed; vias configured to electrically connect the first wiring pattern formed on the first main surface with the second wiring pattern formed on the surface of the specific layer; and vias for heat transfer, configured to connect a mount area for the switching element on the first main surface with the second main surface, in an area on a side of the opposing current path. The heat dissipation member is in contact with the second main surface, and heat generated in the switching element is dissipated by the heat dissipation member through the vias for heat transfer.

The first wiring pattern, which is provided on the first main surface of the multilayer circuit board and includes the virtual shortest current path that connects the circuit elements including the switching element and mounted along the predetermined direction to each other, is connected, through the vias, with the second wiring pattern which is provided on the surface of the specific layer including the second main surface of the multilayer circuit board, and includes the opposing current path that opposes the virtual shortest current path, whereby a current path is formed from the first wiring pattern to the second wiring pattern through the vias. The virtual shortest current path and the opposing current path are arranged so as to overlap each other as viewed in the direction perpendicular to the main surface, and thereby the directions of currents flowing in these paths are opposite to each other. Thus, the magnetic fields, which occur in the circuit board thickness direction due to the currents flowing in the virtual shortest current path and the opposing current path, are in opposite directions and are canceled each other. Therefore, adverse effect of parasitic inductance caused by the change in the currents is effectively reduced (hereinafter also referred to as "inductance canceling effect"). Furthermore, heat generated in the switching element mounted on the first main surface is transferred to the second main surface through the vias for heat transfer, and is efficiently dissipated through the heat dissipation member being in contact with the second main surface.

(2) When the vias for heat transfer are provided so as to be located at both side portions across the opposing current path, the virtual shortest current path and the opposing current path can be symmetrically arranged without positional shifting as viewed in the direction perpendicular to the main surface, whereby the magnetic fields that occur along the circuit board due to the currents flowing in the paths are effectively canceled each other.

(3) When a wiring pattern for heat transfer is formed on either the first main surface or the second main surface so as to surround the vias for heat transfer, more efficient heat dissipation is realized.

(4) The power conversion circuit is a synchronous rectification step-down regulator in which a capacitor is connected in parallel to a series circuit of a high-side switching element and a low-side switching element. The virtual shortest current path is preferably a current path connecting the capacitor to the low-side switching element via the high-side switching element.

A synchronous rectification step-down regulator is advantageous over an asynchronous rectification step-down regulator in that power loss can be significantly reduced. However, a large value of parasitic inductance may cause switching loss, difficulty in securing a dead time, or damage to the high-side switching element due to a large surge voltage applied thereto.

Meanwhile, when the virtual shortest current path that extends from the capacitor to the low-side switching element via the high-side switching element is formed on the first main surface while the opposing current path is formed on the second main surface so as to oppose the virtual shortest current path, the value of parasitic inductance is significantly reduced, whereby switching loss is reduced, and a dead time can be easily secured. Moreover, a low withstand voltage switching element having a low ON resistance and less conduction loss can be adopted. Simultaneously, heat generated in the switching element is transferred to the second main surface through the vias for heat transfer, and is efficiently dissipated through the heat dissipation member.

DETAILS OF EMBODIMENTS

Next, an embodiment of the present disclosure will be described more specifically. The present disclosure is not limited to the embodiment and is indicated by the claims, and is intended to include meaning equivalent to the claims and all modifications within the scope of the claims.

Configuration of Power Conversion Circuit

Figure 1:
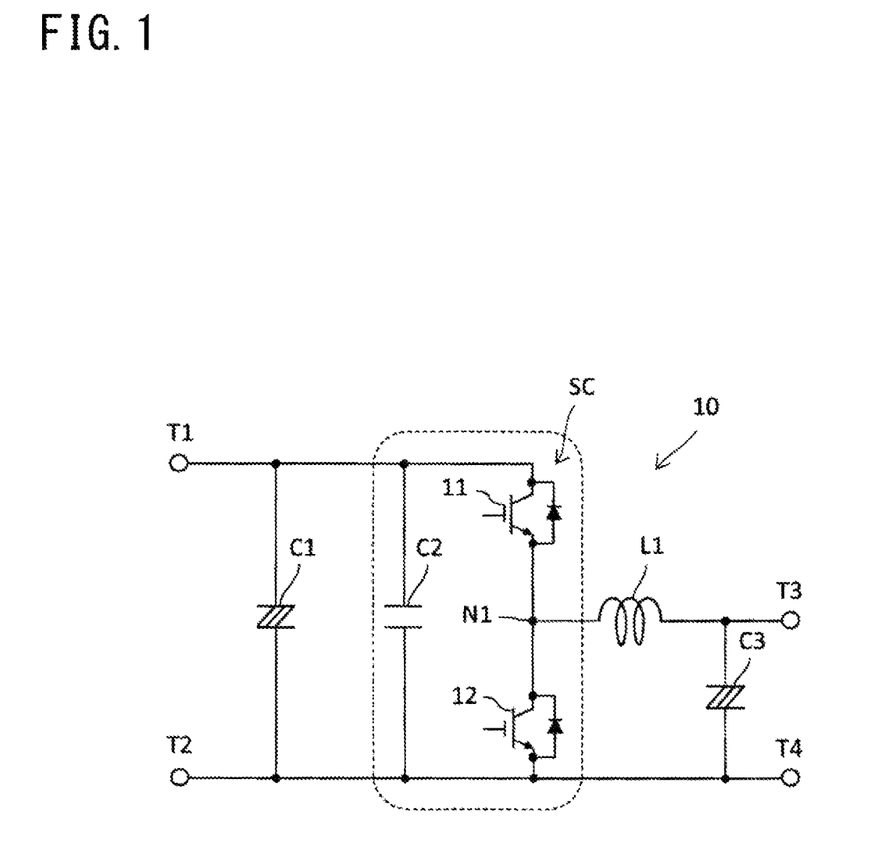
FIG. 1 is a circuit diagram of a DC regulator as an example of an electronic circuit device.

FIG. 1 is a circuit diagram of a synchronous rectification step-down regulator as an example of a power conversion circuit to be incorporated in an electronic circuit device of the present disclosure. The synchronous rectification step-down regulator 10 is a non-insulated synchronous rectification step-down regulator used for stepping down an output voltage of a high-voltage (DC 48 V) storage battery such as a lithium ion battery to a low voltage (DC 12 V) and applying the voltage to various on-vehicle auxiliary machines, or for charging a low-voltage storage battery such as a lead storage battery.

The step-down regulator 10 is composed of: an electrolytic capacitor C1, for voltage stabilization, connected between input terminals T1 and T2; a bypass capacitor C2 connected in parallel to the electrolytic capacitor C1; a switching circuit SC connected in parallel to the capacitors C1 and C2; a choke coil L1; and a smoothing capacitor C3.

The switching circuit SC is composed of a series circuit of a high-side switching element 11 and a low-side switching element 12. The choke coil L1 is connected between an output terminal T3 and a connection node N1 of the switching elements 11, 12. The smoothing capacitor C3 is connected between the output terminals T3 and T4. As the switching elements, MOS-FETs or IGBTs are preferably adopted.

Gate voltages of the high-side switching element 11 and the low-side switching element 12 are controlled so as to alternately turn on the switching elements 11, 12 with a constant dead time in which both the switching elements 11, 12 are in the off states. When the high-side switching element 11 is turned on, the smoothing capacitor C3 is charged from the input terminal T1 through the high-side switching element 11 and the choke coil L1. At this time, energy is stored in the choke coil L1.

Thereafter, the high-side switching element 11 is turned off, and when the low-side switching element 12 is turned on after the dead time, the energy stored in the choke coil L1 is discharged along a closed loop including the low-side switching element 12, whereby the smoothing capacitor C3 is charged.

By adjusting switching duties of the high-side switching element 11 and the low-side switching element 12, a desired DC voltage is outputted between the output terminals T3 and T4. Although not shown in the drawing, the step-down regulator 10 is further provided with a control circuit configured to monitor the voltage between the output terminals T3 and T4 and control the gate voltages of the high-side switching element 11 and the low-side switching element 12.

Figure 8:
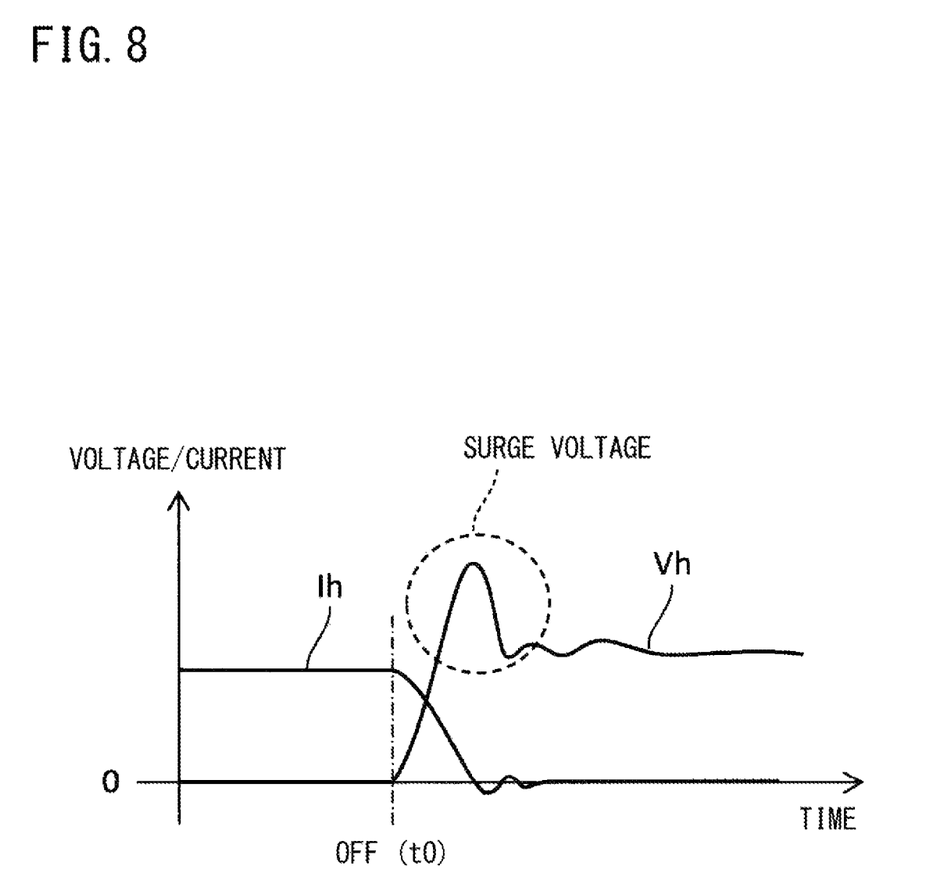
FIG. 8 illustrates a switching waveform of a high-side switching element when parasitic inductance is great.

FIG. 8 shows a voltage waveform Vh and a current waveform Ih obtained at both ends of the high-side switching element 11 when the power conversion circuit shown in FIG. 1 is incorporated in a circuit board. If a parasitic inductance value of a circuit portion surrounded by a broken line in FIG. 1 is large, a large surge voltage is generated when the switching element is turned off. In this example, when the high-side switching element 11 transitions from the on state to the off state at time t0, parasitic inductance occurs in the circuit board. This parasitic inductance causes a large surge voltage to be applied to a drain of the high-side switching element 11, and causes falling of a drain current to be gentle.

Such a large surge voltage may cause the high-side switching element 11 to be damaged. However, adopting a high withstand voltage switching element will increase the component cost. Meanwhile, a current that flows when the high-side switching element 11 transitions from the on state to the off state may cause loss due to heat generation, which may degrade the advantage that the synchronous rectification step-down regulator has less power loss than an asynchronous rectification step-down regulator that uses a diode instead of a low-side switching element.

Configuration of Electronic Circuit Device of Present Disclosure

Hereinafter, a specific configuration will be described.

FIG. 3A to FIG. 3D show the configuration of the switching elements 11, 12 preferably used in the present disclosure. An FET chip is accommodated in a ceramic or resin package 13 having a substantially rectangular parallelepiped shape. Pins serving as a gate terminal G and a source terminal S are extended out from a bottom surface of the package 13. A planar drain terminal D is formed on a rear surface of the package 13 so as to be flush with the rear surface of the package 13.

Figure 2A:
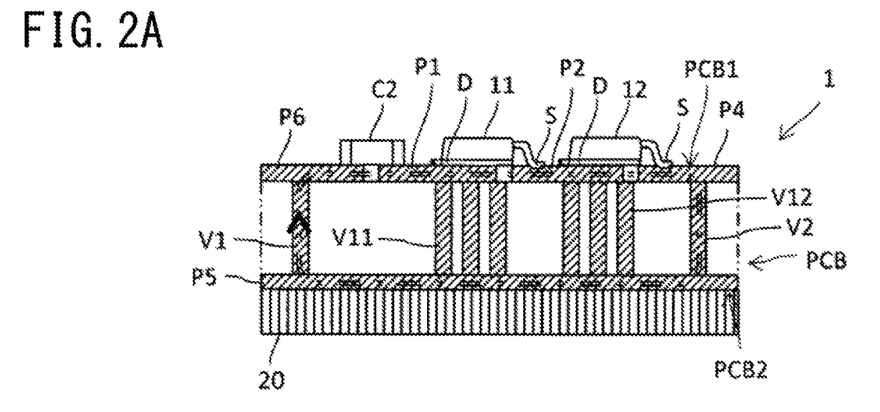
FIG. 2A is a cross-sectional view of a main part of the electronic circuit device.
Figure 2B:
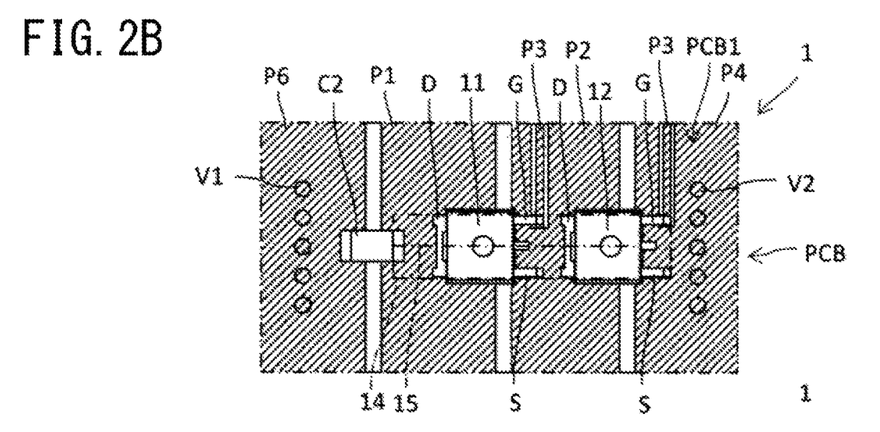
FIG. 2B is a plan view of the main part of the electronic circuit device.
Figure 2C:
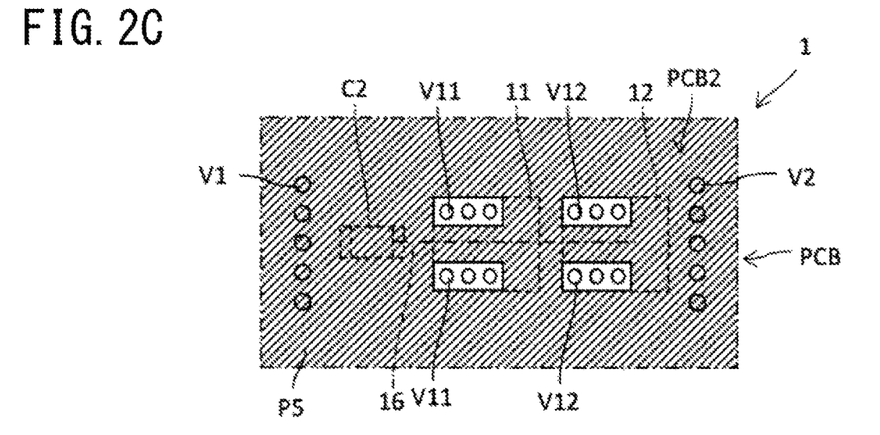
FIG. 2C is a rear view of the main part of the electronic circuit device.
Figure 3A:
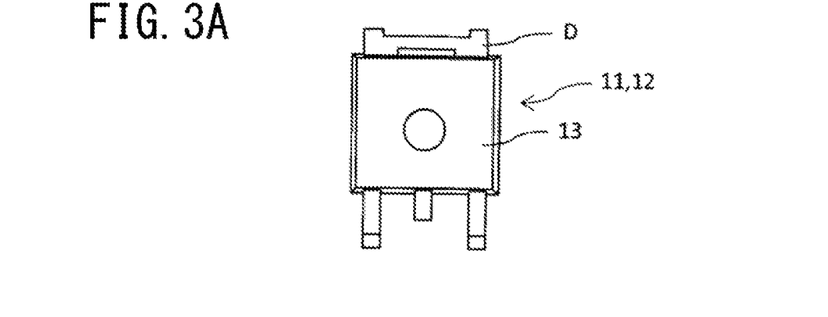
FIG. 3A is a rear view of a switching element used in the electronic circuit device.
Figure 3B:
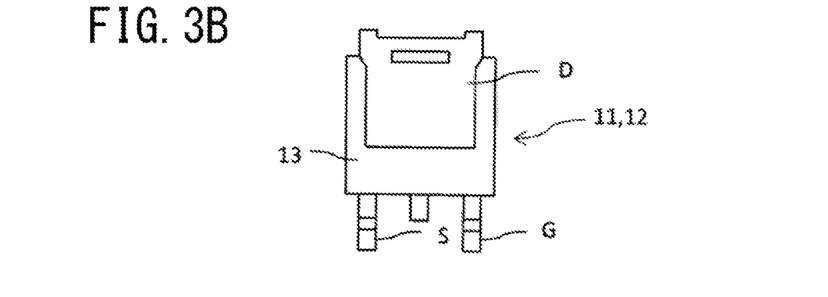
FIG. 3B is a front view of the switching element used in the electronic circuit device.
Figure 3C:
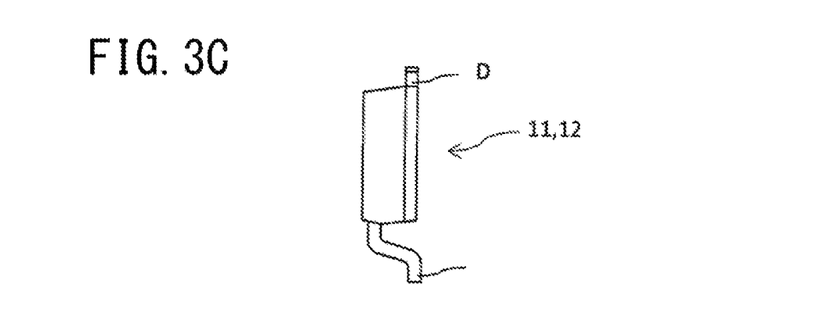
FIG. 3C is a side view of the switching element used in the electronic circuit device.
Figure 3D:
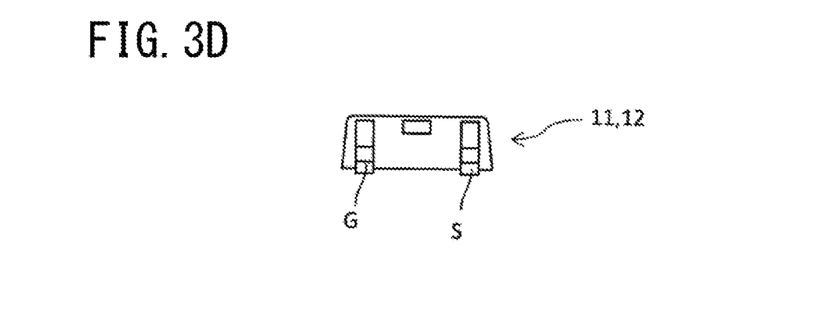
FIG. 3D is a bottom view of the switching element used in the electronic circuit device.

As shown in FIG. 2A, FIG. 2B, and FIG. 2C, the electronic circuit device 1 is composed of: a circuit board PCB incorporating a power conversion circuit (step-down regulator) 10; and an aluminum plate, serving as a heat dissipation member 20, which is fixed in contact with one main surface PCB2 of the circuit board PCB. The electronic circuit device 1 is fixable by bolts to a vehicle body or an on-vehicle device via mount holes (not shown) formed in the aluminum plate.

The circuit board PCB is, for example, a double-sided board made of glass epoxy resin. On a first main surface PCB1 of the circuit board PCB, the capacitor C2, the high-side switching element 11, and the low-side switching element 12, which are the circuit elements forming the synchronous rectification step-down regulator 10, are mounted along a predetermined direction. In addition, first wiring patterns P1 (on the input terminal T1 side in FIG. 1), P2 (on the connection node N1 side in FIG. 1), P4 (on the ground side in FIG. 1), and P6 (on the ground side in FIG. 1) including a virtual shortest current path that connects the respective circuit elements along the predetermined direction, are formed. In this embodiment, the predetermined direction is a linear direction from left to right. A linear band shaped current path 14 subsumes the electrodes of the capacitor C2, the high-side switching element 11, and the low-side switching element 12, and a linear path, which is represented by a center line of the current path 14 or by a band shape having a predetermined width and centered around the center line, serves as a virtual shortest current path 15.

That is, one terminal (a right-side terminal in FIG. 2A) of the capacitor C2 is connected to the drain terminal D of the high-side switching element 11 by the wiring pattern P1. The source terminal S of the high-side switching element 11 is connected to the drain terminal D of the low-side switching element 12 by the wiring pattern P2. The source terminal S of the low-side switching element 12 is connected to a wiring pattern P5 on a second main surface PCB2 through vias V2. In addition, the other terminal (a left-side terminal in FIG. 2A) of the capacitor C2 is connected to the wiring pattern P5 on the second main surface PCB2 through the wiring pattern P6 and vias V1.

On the second main surface PCB2 opposing the first main surface PCB1, the second wiring pattern P5 (on the ground side in FIG. 1), which includes an opposing current path 16 that opposes an area where the virtual shortest current path 15 is formed. The first wiring pattern P6 and the second wiring pattern P5 are electrically connected to each other through the five vias V1, and the first wiring pattern P4 and the second wiring pattern P5 are electrically connected to each other through the five vias V2, whereby a current path shown by an alternate long and short dash line in FIG. 2A is formed.

The opposing current path 16 is a current path that is formed so as to oppose the area where the virtual shortest current path 15 is formed and to overlap with the virtual shortest current path as viewed in a direction perpendicular to the main surfaces PCB1, PCB2. When the virtual shortest current path 15 is formed as a band-shaped area having a predetermined width, the opposing current path 16 need not 100% overlap with the virtual shortest current path 15. A portion of the opposing current path 16 in the entire range along the virtual shortest current path 15 may overlap with the virtual shortest current path 15. Preferably, the percentage of overlap with the virtual shortest current path 15 is equal to or more than 50%.

As in this embodiment, when the virtual shortest current path 15 and the opposing current path 16 are arranged so as to overlap each other as viewed in the direction perpendicular to the main surfaces PCB1, PCB2 and thereby the directions of currents flowing in the respective paths are opposite to each other, an inductance canceling effect is provided, whereby, for example, a surge voltage that occurs when the high-side switching element 11 is turned off is reduced.

Figure 4:
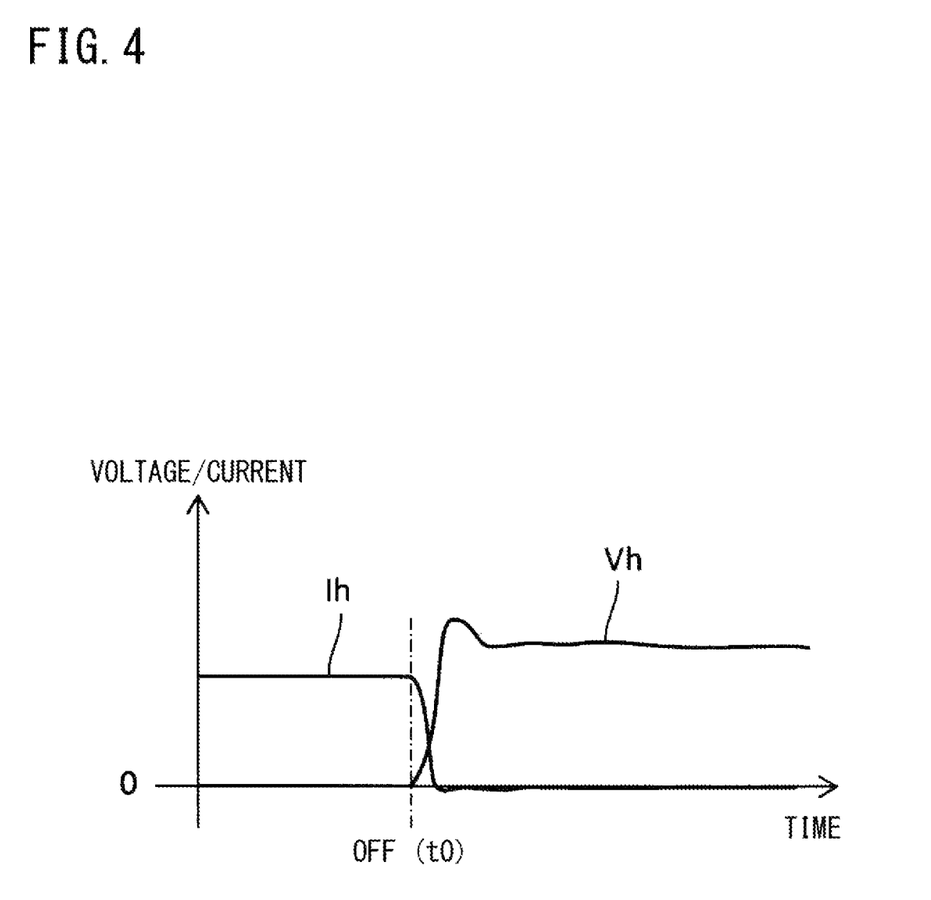
FIG. 4 illustrates a switching waveform of a high-side switching element when parasitic inductance is small.

As shown in FIG. 4, when the parasitic inductance value of the circuit portion surrounded by the broken line in FIG. 1 is reduced, the level of the surge voltage that occurs when the high-side switching element 11 is turned off (time t0) is lowered, and falling of the drain current becomes steep, which leads to a significant reduction in switching loss. This makes it unnecessary to use a high withstand voltage switching element, which is expensive.

Furthermore, vias V11, V11, V12, V12 for heat transfer are formed so as to connect the mount areas for the switching elements 11, 12 on the first main surface PCB1 with areas in the second main surface PCB2 on the both sides across the opposing current path 16.

The wiring pattern P1 formed on the first main surface PCB1 and the vias V11 are conducted through a wiring pattern for conduction, the wiring pattern P2 and the vias V12 are conducted through a wiring pattern for conduction, and end portions of the vias V11, V12 on the second main surface PCB2 side may be coated with an insulating layer. Alternatively, the wiring pattern P5 formed on the second main surface PCB2 and the vias V11, V12 are conducted through a wiring pattern for conduction, and end portions of the vias V11, V12 on the first main surface PCB1 side may be coated with an insulating layer. Still alternatively, any peripheral end portions of the vias V11, V12 may be coated with an insulating layer.

Since the virtual shortest current path 15 and the opposing current path 16 are arranged so as to overlap each other as viewed in the direction perpendicular to the main surfaces PCB1, PCB2 and thereby the directions of currents flowing in the respective paths are opposite to each other, a sufficient inductance cancelling effect is attained. In addition, heat, which is generated in the switching elements 11, 12 mounted on the first main surface PCB1, is transferred to the second main surface PCB2 through the vias V11, V11, V12, V12 for heat transfer, and is efficiently dissipated through the heat dissipation member 20 being in contact with the second main surface PCB2.

Configuration of Electronic Circuit Device According to Comparison Example 1

Figure 7A:
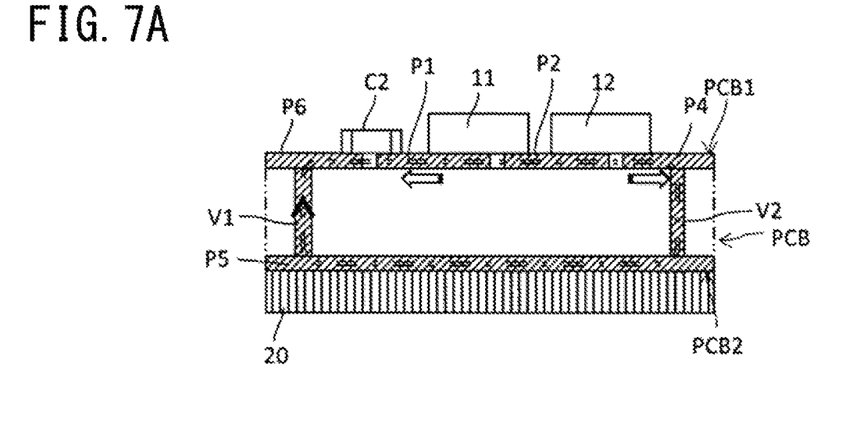
FIG. 7A is a cross-sectional view of a main part of an electronic circuit device according to a second comparative example, illustrating current paths in the electronic circuit device.
Figure 7B:
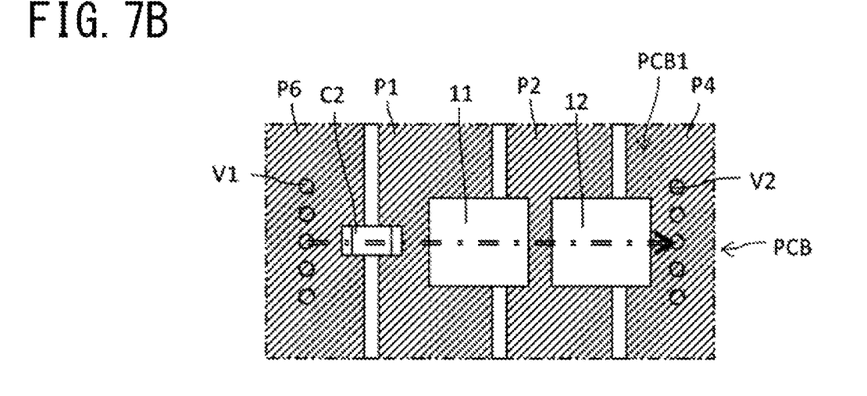
FIG. 7B is a plan view of the main part of the electronic circuit device according to the second comparative example, illustrating the current paths in the electronic circuit device.
Figure 7C:
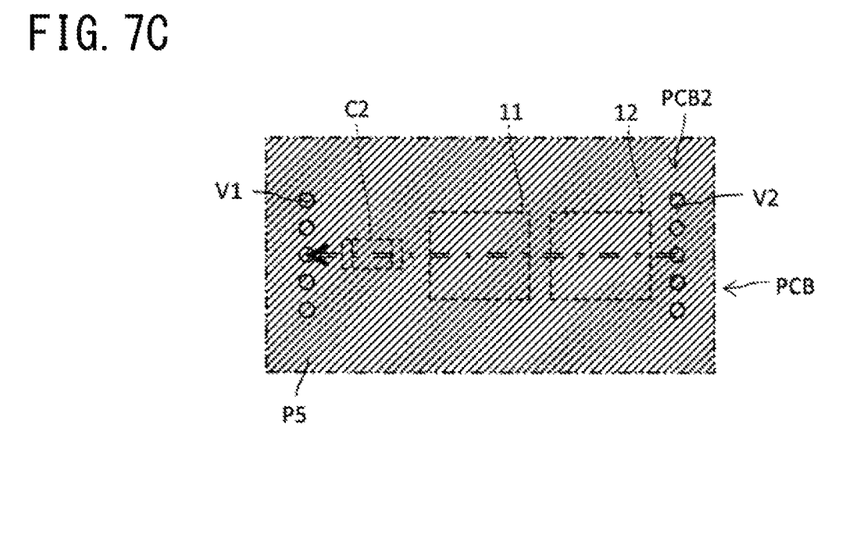
FIG. 7C is a rear view of the main part of the electronic circuit device according to the second comparative example, illustrating the current paths in the electronic circuit device.

FIG. 7A, FIG. 7B, and FIG. 7C show an example of a configuration of a main portion of the electric circuit device 1 (a circuit portion surrounded by a broken line in FIG. 1) which is improved to reduce a surge voltage. The electronic circuit device 1 is composed of: a circuit board PCB incorporating a power conversion circuit 10; and an aluminum plate, serving as a heat dissipation member 20, which is fixed in contact with one main surface PCB2 of the circuit board PCB. The electronic circuit device 1 is fixed by bolts to a vehicle body or an on-vehicle device via mount holes formed in the aluminum plate. In FIG. 7A, FIG. 7B, and FIG. 7C, the switching elements 11, 12 are shown not with detailed shapes but with schematic shapes thereof.

On a first main surface PCB1 of the circuit board PCB, a capacitor C2, a high-side switching element 11, and a low-side switching element 12, which are circuit elements forming the synchronous rectification step-down regulator 10, are mounted along a predetermined direction. In addition, a first wiring patterns P1 (on the input terminal T1 side in FIG. 1), P2 (on the connection node N1 side in FIG. 1), P4 (on the ground side in FIG. 1), and P6 (on the ground side in FIG. 1) including a virtual shortest current path that connects the respective circuit elements along the predetermined direction, are formed. Also in this example, the predetermined direction is a linear direction from left to right (refer to an arrow in FIG. 7B). A linear band shaped current path subsumes the electrodes of the capacitor C2, the high-side switching element 11, and the low-side switching element 12, and a linear path, which is represented by a center line of the current path or by a band shape having a predetermined width and centered around the center line, serves as the virtual shortest current path.

On a second main surface PCB2 opposing the first main surface PCB1, a second wiring pattern P5 (on the ground side in FIG. 1), which includes an opposing current path that opposes an area where the virtual shortest current path is formed, is formed. The first wiring pattern P6 and the second wiring pattern P5 are electrically connected to each other through the five vias V1, and the second wiring pattern P4 and the second wiring pattern P5 are electrically connected to each other through the five vias V2, whereby a current path shown by an alternate long and short dash line in FIG. 7A is formed.

As described above, the opposing current path is a current path that is formed so as to oppose the area where the virtual shortest current path is formed and to overlap with the virtual shortest current path as viewed in a direction perpendicular to the main surfaces PCB1, PCB2.

As in this example, when the virtual shortest current path and the opposing current path are arranged so as to overlap each other as viewed in the direction perpendicular to the main surfaces PCB1, PCB2 and thereby the directions of currents flowing in the respective paths are opposite to each other, the magnetic fields, which occur in the circuit board thickness direction due to the currents flowing in the virtual shortest current path and the opposing current path, are in opposite directions and are canceled each other. Therefore, adverse effect of parasitic inductance caused by the change in currents is effectively reduced.

In the electronic circuit device 1 shown in FIG. 7A, FIG. 7B, and FIG. 7C, however, the heat dissipation member 20 cannot be effectively used to avoid thermal damage of the high-side switching element 11 and the low-side switching element 12 that generate heat along with switching operations thereof, and therefore, it is necessary to attach a heat dissipation member such as a heat dissipation fin directly to each switching element 11, 12. The reason is as follows. As shown by outline arrows in FIG. 7A, the heat dissipation paths from the switching elements 11, 12 are limited to the wiring patterns P1, P2, and P4, and heat is transferred to the wiring pattern P5 on the second main surface PCB2 through the vias V2, so that the amount of heat dissipation from the heat dissipation member 20 being in contact with the second main surface PCB2 is significantly small.

Configuration of Electronic Circuit Device According to Comparative Example 2

Figure 6A:
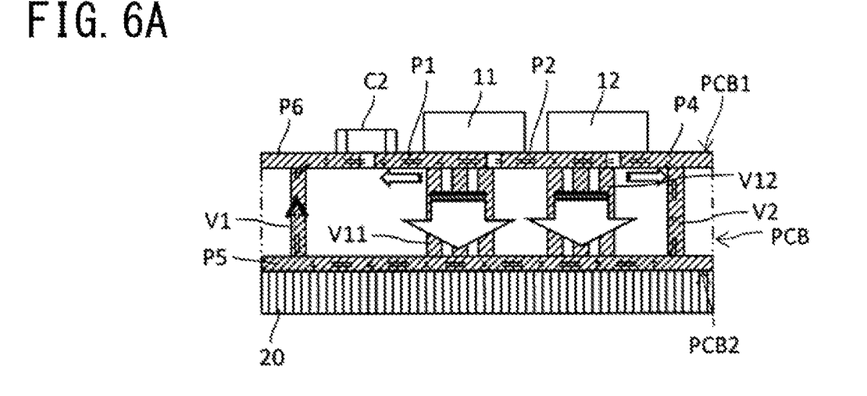
FIG. 6A is a cross-sectional view of a main part of an electronic circuit device according to a first comparative example, illustrating current paths in the electronic circuit device.
Figure 6B:
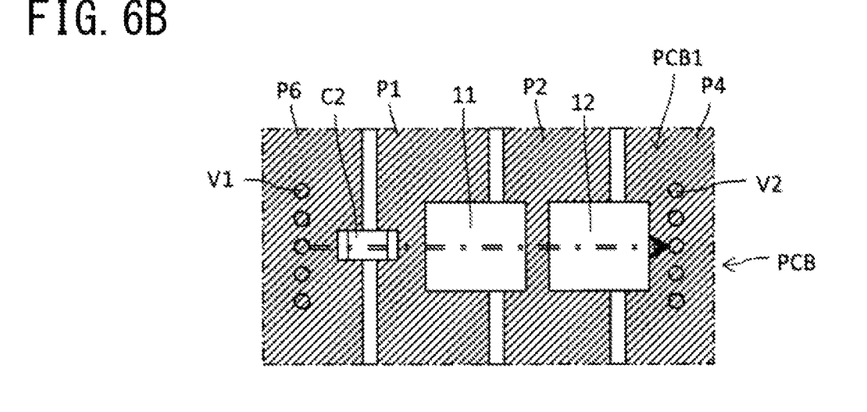
FIG. 6B is a plan view of the main part of the electronic circuit device according to the first comparative example, illustrating the current paths in the electronic circuit device.
Figure 6C:
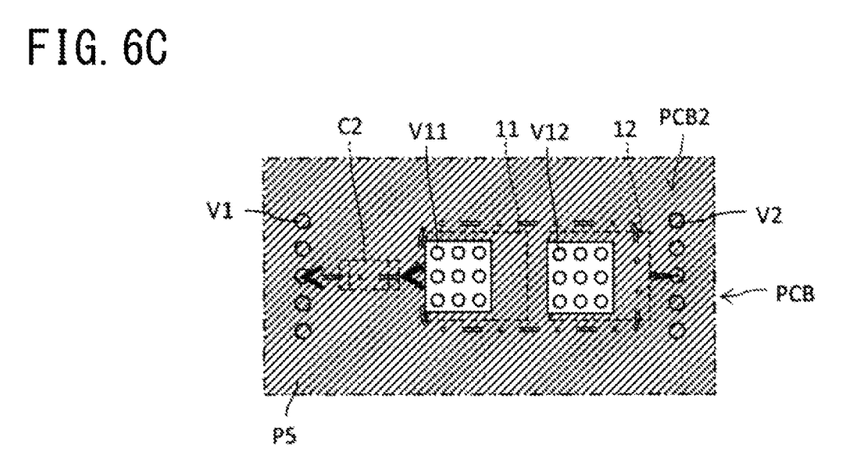
FIG. 6C is a rear view of the main part of the electronic circuit device according to the first comparative example, illustrating the current paths in the electronic circuit device.

FIG. 6A, FIG. 6B, and FIG. 6C show an example of an electronic circuit device 1 capable of efficiently dissipating heat from the heat dissipation member 20 in response to heat generation of each switching element 11, 12. In the figures, the same components as those shown in FIG. 7A, FIG. 7B, and FIG. 7C are designated by the same reference numerals.

This example is different from the example shown in FIG. 7A, FIG. 7B, and FIG. 7C in that the vias V11, V12 are formed in the mount areas for the switching elements 11, 12 on the circuit board PCB. In this example, 9 (3 rows×3 columns) vias are formed in a rectangular area. Heat generated in the switching elements 11, 12 is transferred to the heat dissipation member 20 through the vias V11, V12.

The electronic circuit device 1 shown in FIG. 6A, FIG. 6B, and FIG. 6C has better heat dissipation performance for the switching elements 11, 12 than the electronic circuit device 1 shown in FIG. 7A, FIG. 7B, and FIG. 7C. However, since the virtual shortest current path or the opposing current path to be formed so as to oppose the virtual shortest current path is formed so as to bypass the vias V11, V12 (refer to an alternate long and short dash line in FIG. 6C), the inductance canceling effect is degraded.

Contrast to Comparative Examples

Figure 5A:
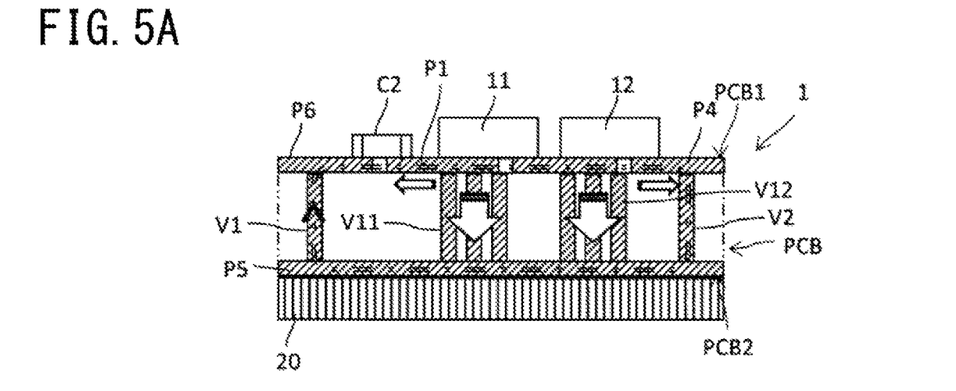
FIG. 5A is a cross-sectional view of a main part of an electronic circuit device according to the present disclosure, illustrating current paths in the electronic circuit device.
Figure 5B:
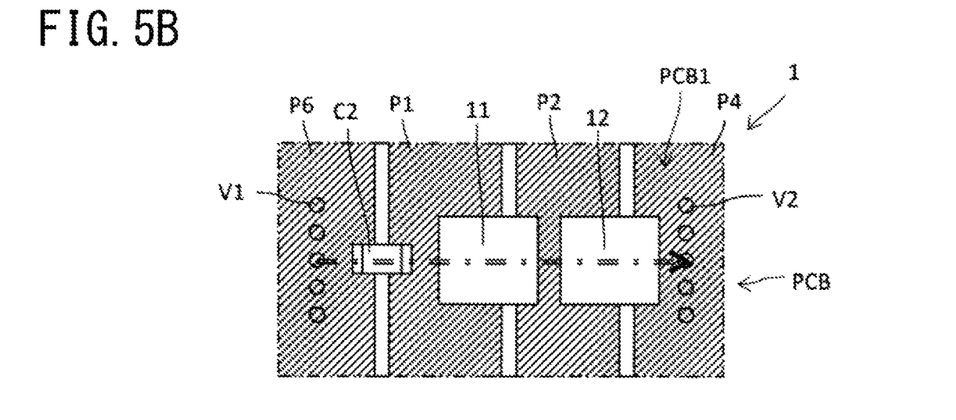
FIG. 5B is a plan view of the main part of the electronic circuit device according to the present disclosure, illustrating the current paths in the electronic circuit device.
Figure 5C:
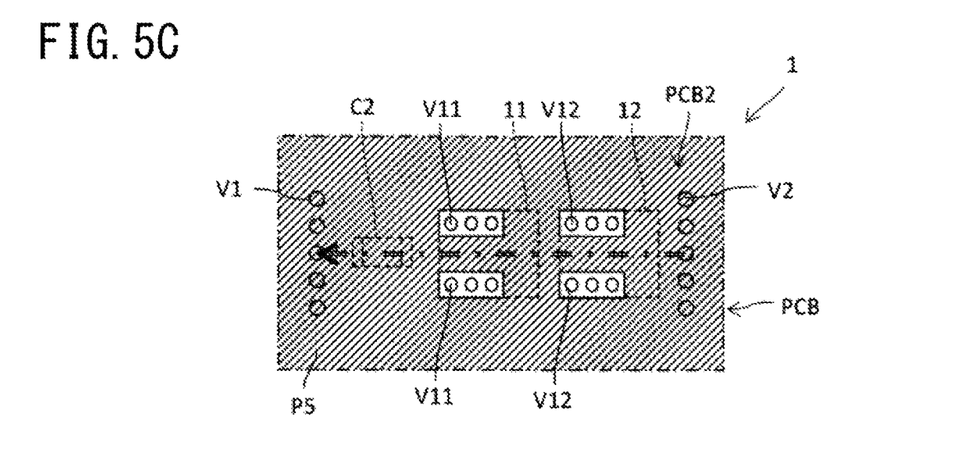
FIG. 5C is a rear view showing the main part of the electronic circuit device according to the present disclosure, illustrating the current paths in the electronic circuit device.

FIG. 5A, FIG. 5B, and FIG. 5C show schematic shapes of the switching elements 11, 12 instead of the specific shapes thereof shown in FIG. 2A, FIG. 2B, and FIG. 2C. FIG. 5A, FIG. 5B, and FIG. 5C show a configuration of an electronic circuit device 1 whose inductance canceling effect and heat dissipation effect are superior to those of the comparative examples shown in FIG. 6A, FIG. 6B, and FIG. 6C, and FIG. 7A, FIG. 7B, and FIG. 7C. In the figures, the same components as those shown in FIG. 6A, FIG. 6B, FIG. 6C, FIG. 7A, FIG. 7B, and FIG. 7C are designated by the same reference numerals.

The configuration shown in FIG. 5A, FIG. 5B, and FIG. 5C is different from the configuration shown in FIG. 6A, FIG. 6B, and FIG. 6C in that vias V11, V11, V12, V12 for heat transfer are formed in the mount areas for the switching elements 11, 12 on the circuit board PCB. The vias V11, V11, V12, V12 connect the mount areas for the switching elements 11, 12 on the first main surface PCB1 with the areas in the second main surface PCB2 on the both sides across the opposing current path.

As already described with reference to FIG. 2A, FIG. 2B, and FIG. 2C, since the virtual shortest current path and the opposing current path are arranged so as to overlap each other as viewed in the direction perpendicular to the main surfaces PCB1, PCB2 and thereby the directions of currents flowing in the respective paths are opposite to each other, sufficient inductance canceling effect can be achieved. In addition, heat generated in the switching elements 11, 12 mounted on the first main surface PCB1 is transferred to the second main surface PCB2 through the vias V11, V11, V12, V12 for heat transfer, and is efficiently dissipated through the heat dissipation member 20 being in contact with the second main surface PCB2.

Other Embodiments

While the vias V11, V11, V12, V12 are formed in the areas on the both sides across the opposing current path in the above embodiment, these vias may be formed in the area on either side of the opposing current path.

Heat dissipation fins may be attached to the rear surfaces of the switching elements 11, 12 mounted on the first main surface PCB1.

While the switching element shown in FIG. 3 has a shape conforming to a package code "TO252", the shape of the switching element to which the present disclosure is applicable is not limited to this code. The present disclosure is widely applicable to switching elements that belong to a category of TO (Transistor Outline), and incorporate heat dissipation units.

While the DC regulator is a synchronous rectification step-down regulator in the above embodiment, the DC regulator to which the present disclosure is applicable is not limited to a non-insulated synchronous rectification step-down regulator. The present disclosure is also applicable to an asynchronous rectification step-down regulator, an asynchronous boost regulator, and an asynchronous boost/step-down regulator. Needless to say, the present disclosure is applicable to an insulating step-down regulator, an insulating boost regulator, and an insulating boost/step-down regulator.

The present disclosure is applicable not only to a DC regulator but to any regulator circuit using switching elements. For example, the present disclosure is widely applicable to power conversion circuits such as a full-bridge inverter circuit and a half-bridge inverter circuit.

While a metal plate mode of aluminum is adopted as the heat dissipation member 20 in the above embodiment, a highly heat conductive metal such as copper may be adopted. Further, the material of the circuit board 3 is not limited to glass epoxy resin, and any known material may be used as appropriate.

In the above embodiment, the circuit board 3 is composed of a double-sided board. However, the circuit board to which the present disclosure is applicable may be composed of a multilayer circuit board including a double-sided board. For example, when a three-layer circuit board is adopted, with an intermediate layer being a specific layer surface, a second wiring pattern having an opposing current path as described above may be formed on the specific layer surface. The circuit board 3 may be composed of multiple layers not less than three layers.

That is, the electronic circuit device according to the present disclosure includes: a multilayer circuit board having mounted thereon a plurality of circuit elements including a switching element to form a power conversion circuit, the multilayer circuit board having formed a wiring pattern electrically connecting the circuit elements to each other; and a heat dissipation member being in contact with the multilayer circuit board. Preferably, the electronic circuit device includes: a first wiring pattern formed on a first main surface of the multilayer circuit board, the first wiring pattern having the circuit elements including the switching element, mounted thereon along a predetermined direction, the first wiring pattern including a virtual shortest current path connecting the circuit elements to each other along the predetermined direction; a second wiring pattern formed on a surface of a specific layer including a second main surface opposing the first main surface, the second wiring pattern including an opposing current path that opposes an area where the virtual shortest current path is formed; vias configured to electrically connect the first wiring pattern formed on the first main surface with the second wiring pattern formed on the surface of the specific layer; and vias for heat transfer, configured to connect a mount area for the switching element on the first main surface with the second main surface, in an area on a side of the opposing current path. The heat dissipation member is in contact with the second main surface, and heat generated in the switching element is dissipated by the heat dissipation member through the vias for heat transfer.

REFERENCE SIGNS LIST

1 electronic circuit device
3 circuit board
10 synchronous rectification step-down regulator (DC regulator, step-down regulator, power conversion circuit)
11 high-side switching element
12 low-side switching element
13 resin package
14 current path
15 virtual shortest current path
16 opposing current path
20 heat dissipation member
C1 electrolytic capacitor
C2 capacitor
C3 smoothing capacitor
L1 choke coil
N1 connection node
P1, P2, P4, P6 wiring pattern
P5 wiring pattern
PCB multilayer circuit board (circuit board)
PCB1 first main surface
PCB2 second main surface
SC switching circuit
T1, T2 input terminal
T3, T4 output terminal
V1, V2, V11, V12 via

The invention claimed is:

1. An electronic circuit device provided with:
   a multilayer circuit board having mounted thereon a plurality of circuit elements including a switching element to form a power conversion circuit, the multilayer circuit board having formed a wiring pattern electrically connecting the circuit elements to each other; and
   a heat dissipation member being in contact with the multilayer circuit board,
   the electronic circuit device comprising:
      a first wiring pattern formed on a first main surface of the multilayer circuit board, the first wiring pattern having the plurality of circuit elements including the switching element, mounted thereon along a predetermined direction, the first wiring pattern including a virtual shortest current path connecting the circuit elements to each other along the predetermined direction;
      a second wiring pattern formed on a surface of a specific layer including a second main surface opposing the first main surface, the second wiring pattern including an opposing current path that opposes an area where the virtual shortest current path is formed;
      vias configured to electrically connect the first wiring pattern formed on the first main surface with the second wiring pattern formed on the surface of the specific layer; and
      vias for heat transfer, configured to connect a mount area for the switching element on the first main surface with the second main surface, in an area on a side of the opposing current path, wherein the heat dissipation member is in contact with the second main surface, and heat generated in the switching element is dissipated by the heat dissipation member through the vias for heat transfer.

2. The electronic circuit device according to claim 1, wherein the vias for heat transfer are provided so as to be located at both side portions across the opposing current path.

3. The electronic circuit device according to claim 2, wherein a wiring pattern for heat transfer is formed on either the first main surface or the second main surface so as to surround the vias for heat transfer.

4. The electronic circuit device according to claim 2, wherein
the power conversion circuit is a synchronous rectification step-down regulator in which a capacitor is connected in parallel to a series circuit of a high-side switching element and a low-side switching element, and
the virtual shortest current path is a current path connecting the capacitor to the low-side switching element via the high-side switching element.

5. The electronic circuit device according to claim 1, wherein a wiring pattern for heat transfer is formed on either the first main surface or the second main surface so as to surround the vias for heat transfer.

6. The electronic circuit device according to claim 5, wherein
the power conversion circuit is a synchronous rectification step-down regulator in which a capacitor is connected in parallel to a series circuit of a high-side switching element and a low-side switching element, and
the virtual shortest current path is a current path connecting the capacitor to the low-side switching element via the high-side switching element.

7. The electronic circuit device according to claim 1, wherein
the power conversion circuit is a synchronous rectification step-down regulator in which a capacitor is connected in parallel to a series circuit of a high-side switching element and a low-side switching element, and
the virtual shortest current path is a current path connecting the capacitor to the low-side switching element via the high-side switching element.

8. The electronic circuit device according to claim 1, wherein the vias for heat transfer are provided so as to be located at least one of both side portions across the opposing current path.

9. The electronic circuit device according to claim 1, wherein
the vias for heat transfer are formed in the mount area for the switching element, and
the opposing current path is formed to pass beside a back area of the mount area of the switching element.

10. An electronic circuit device provided with:
a multilayer circuit board having mounted thereon a plurality of circuit elements including a switching element to form a power conversion circuit, the multilayer circuit board having formed a wiring pattern electrically connecting the circuit elements to each other; and
a heat dissipation member being in contact with the multilayer circuit board,
the electronic circuit device comprising:
a first wiring pattern formed on a first main surface of the multilayer circuit board, the first wiring pattern having the plurality of circuit elements including the switching element, mounted thereon along a predetermined direction, the first wiring pattern including a virtual shortest current path connecting the circuit elements to each other along the predetermined direction;
a second wiring pattern formed on a surface of a specific layer including a second main surface opposing the first main surface, the second wiring pattern including an opposing current path that opposes an area where the virtual shortest current path is formed; and
vias configured to electrically connect the first wiring pattern formed on the first main surface with the second wiring pattern formed on the surface of the specific layer, wherein
during a current path is formed among the first wiring pattern, the vias and the second wiring pattern, a current flowing direction through the virtual shortest current path and a current flowing direction through the opposing current path are opposite to each other.

* * * * *